(12) United States Patent
Kruangam

(10) Patent No.: US 6,403,984 B1
(45) Date of Patent: Jun. 11, 2002

(54) AMORPHOUS SEMICONDUCTOR PHOTOCOUPLER

(75) Inventor: Dusit Kruangam, Bangkok (TH)

(73) Assignee: Chulalongkorn University (TH)

( * ) Notice: Subject to any disclaimer, the term of this patent is extended or adjusted under 35 U.S.C. 154(b) by 0 days.

(21) Appl. No.: 08/421,089

(22) Filed: Apr. 13, 1995

(30) Foreign Application Priority Data

Apr. 15, 1994 (AU) ............................................ PM 5121

(51) Int. Cl.[7] .............................................. H01L 33/00
(52) U.S. Cl. ...................................... 257/80; 257/458
(58) Field of Search .................................. 257/80, 458

(56) References Cited

U.S. PATENT DOCUMENTS

| | | | | |
|---|---|---|---|---|
| 4,499,331 A | * | 2/1985 | Hamakawa et al. | ......... 257/458 |
| 4,667,212 A | * | 5/1987 | Nakamura | .................. 257/458 |

FOREIGN PATENT DOCUMENTS

DE                2422330    *    5/1974

OTHER PUBLICATIONS

Potemski et al, "Increased Light Emitting Diode Efficiency", *IBM Tech* vol. 15 #10, Mar. 73.*

* cited by examiner

*Primary Examiner*—Stephen D. Meier
(74) *Attorney, Agent, or Firm*—Cook, Alex, McFarron, Manzo, Cummings & Mehler, Ltd.

(57) ABSTRACT

A photocoupler comprising a light emitting device and a light detecting device both of which are made of amorphous semiconductors. The light emitting device is an amorphous semiconductor thin film light emitting diode which emits light when stimulated by an electric stimuli. The light detecting device is either an amorphous semiconductor thin film solar cell which produces an electric signal when exposed to light or a photoconductive type amorphous semiconductor thin film whose electrical conductivity varies when exposed to light. Both of these light detecting devices thus give an indication of detected light. These types of photocouplers have low production costs, can be manufactured in different sizes are relatively easy to mass produce and are compact as well as light weight.

25 Claims, 3 Drawing Sheets

AMORPHOUS SEMICONDUCTOR PHOTOCOUPLER

FIELD OF THE INVENTION

This invention is for a photocoupler comprising a light emitting device and a light detecting device both of which are made of amorphous semiconductors.

The light emitting device may be an amorphous semiconductor thin film light emitting diode whilst the light detecting device may be either 1) an amorphous semiconductor thin film solar cell, or 2) photoconductive-type amorphous semiconductor thin film.

The preferable amorphous semiconductor thin films mentioned here are, for example; amorphous silicon, amorphous silicon carbide, amorphous silicon nitride, amorphous silicon oxide or the combination thereof. Since these amorphous semiconductor thin films can be produced at low cost and on any area, the photocoupler made of these materials can be produced at a lower cost as compared with a conventional crystalline photocoupler, and can be produced at any size. The design and production of the amorphous photocoupler can lead to either a photoisolator type or a photointerrupter type, which will be described in latter sections.

The amorphous semiconductor photocoupler may be operated in either DC mode or pulse mode.

BACKGROUND OF THE INVENTION

Conventional photocouplers are made of expensive crystalline semiconductors, such as gallium arsenide (GaAs), cadmium sulfide (CdS), indium phosphide (InP), silicon (Si), etc. The fabrication costs for these crystalline materials are quite high, and the fabrications need a large amount of energy, usually in the form of electricity.

Amorphous semiconductor photocouplers may be prepared by low cost glow discharge plasma chemical vapour deposition (CVD) or other vacuum deposition techniques, and can be produced on any area, and at mass production scale.

The photocouplers may use inexpensive substrates such as glass and/or metal sheets.

A description of the architecture of such an amorphous semiconductor thin film light emitting diode has been disclosed in another application by the same applicant AUPM4832 applied for in the United States.

The use of amorphous materials for photocouplers has also been described in U.S. Pat. No. 4,695,859 by Subhendo Guha and Satish Agarwal whereby the combination of a thin film light emitting diode and a photodiode is used to make a new type of copier machine. The principle of that patent is that the light output from the thin film light emitting diode is reflected from a document (paper) and then detected by the photodiode. The light emitting diode and the photodiode are for that reason located sufficiently spatially apart to allow for the detection of scattered light and are thus individual units.

However, one of the features of this invention allows the amorphous thin film solar cell (photodiode) to be fabricated so that it is deposited onto a surface (back surface say) of a common substrate such as glass, whilst the thin film light emitting diode is deposited onto the opposite (front) surface of the common glass substrate. Such an arrangement leads to the reduction of the cost of the photocoupler.

SUMMARY OF THE INVENTION

In one form of the invention there is a photocoupler comprising an amorphous semiconductor thin film light emitting diode capable of emitting light in response to an electric stimuli and an amorphous semiconductor photoresponsive light detecting means adapted to detect the light emitted by the thin film light emitting diode.

In a further form of the invention there is proposed a photocoupler including an amorphous semiconductor thin film light emitting diode capable of emitting light in response to an electric stimuli, an amorphous semiconductor photovoltaic light detecting means adapted to detect the emitted light of the thin film light emitting diode, said light emitting diode comprising of a first thin film electrode, a plurality of amorphous semiconductor thin films, an optically transparent second thin film electrode, and an optically transparent substrate, arranged in a sandwich type manner, such an arrangement allowing emission of light through the optically transparent substrate when the light emitting diode is electrically stimulated, said photovoltaic light detecting means comprising of a first thin film electrode, a plurality of amorphous semiconductor thin films, an optically transparent second thin film electrode, and an optically transparent substrate, arranged in a sandwich type manner, the optically transparent substrates of both the light emitting diode and the light detecting means adapted to face each other with a spatial predetermined separation.

In a yet further form a photocoupler including an amorphous semiconductor thin film light emitting diode capable of emitting light in response to an electric stimuli, an amorphous semiconductor photoconductive light detecting means adapted to detect the light emitted by the thin film light emitting diode, said light emitting diode comprising of a first thin film electrode, a plurality of amorphous semiconductor thin films, an optically transparent second thin film electrode and an optically transparent substrate, arranged in a sandwich type manner such an arrangement allowing emission of light through the optically transparent substrate when the light emitting diode is electrically stimulated, and said photoconductive light detecting means comprising of an optically transparent substrate, an amorphous silicon thin film and an ohmic thin film electrode, in a sandwich type arrangement the said photoconductive light detecting means positioned so that its optically transparent substrate faces the optically transparent substrate of the light emitting diode with a spatial predetermined separation.

DESCRIPTION OF THE PREFERRED EMBODIMENTS

Turning now to the drawings in detail they illustrate features which can be obtained in accordance with the invention.

Figure 1:
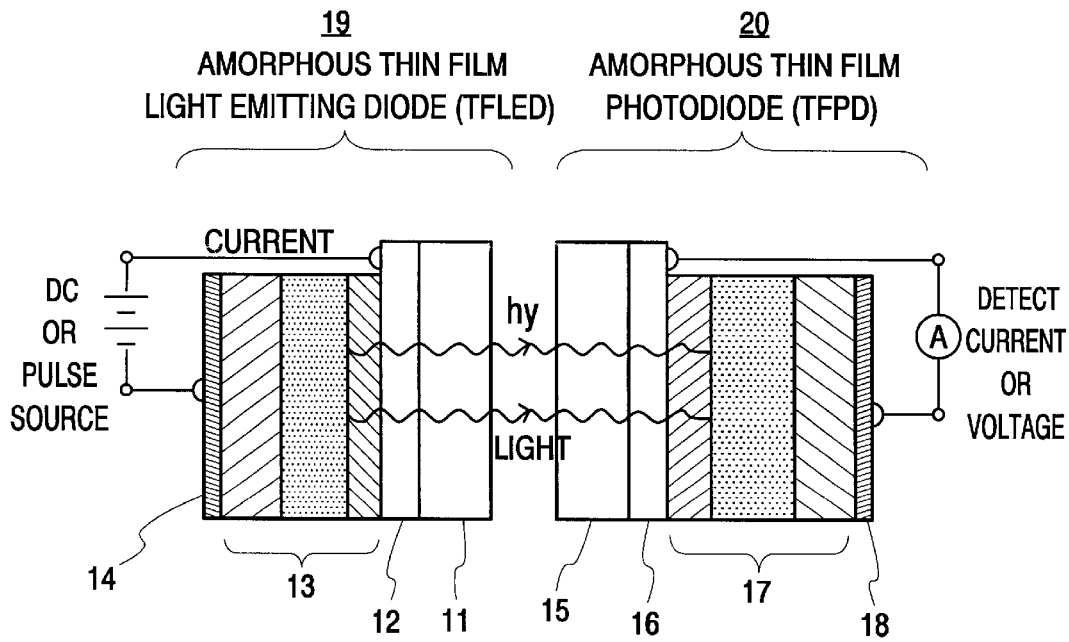
FIG. 1 is a cross-sectional view of the amorphous semiconductor photocoupler comprising a thin film light emitting diode and an amorphous semiconductor thin film solar cell spatially separated.

FIG. 1 is a cross-sectional view of the amorphous semiconductor photocoupler. It comprises an amorphous semiconductor thin film light emitting diode (19) and an amorphous semiconductor thin film solar cell (photodiode) (20). The light emitting diode and the solar cell are spatially separated by a certain distance. The details of the photocoupler are as follows:

11 is an optically transparent substrate, such as glass sheet, which is at least transparent to the electromagnetic emission spectrum of the light emitting diode.

12 is an optically transparent thin film electrode. It can be made of such materials as tin oxide ($SnO_2$), indium tin oxide (ITO), zinc oxide (ZnO), or the combination of these materials, and which is at least transparent to the electromagnetic spectrum of the light emitting diode.

13 is a plurality of amorphous semiconductor thin films having p-i-n or n-i-p junctions and made of such materials as, amorphous silicon (a-SI), amorphous silicon carbide (a-SiC), amorphous silicon nitride (a-SiN), or amorphous silicon oxide (a-SiO), or the combination of these materials.

14 is a thin film electrode, for example aluminium, silver.

15 is the same as 11.

16 is the same as 12.

17 is the same as 13.

18 is the same as 14.

19 us amorphous semiconductor thin film light emitting diode having p-i-n or n-i-p junctions.

20 is amorphous semiconductor thin film solar cell (photodiode) having p-i-n or n-i-p junctions.

The amorphous thin film light emitting diode (19) emits light of energy hv when it is biased in a forward direction for example by a DC or pulsed electrical source. The emitted light is absorbed by the amorphous thin film solar cell (20) and converted into an electrical signal. The electrical signal can be detected through the electrodes 16 and 18 by a suitable apparatus such as a current or voltage meter. The operation of the light detecting solar cell (photodiode) can be done either in a none bias condition or in a reverse bias condition.

For purposes of the invention the relative thicknesses of the layers is to be disregarded, although there may be preferential thickness depending upon the application.

Figure 2:
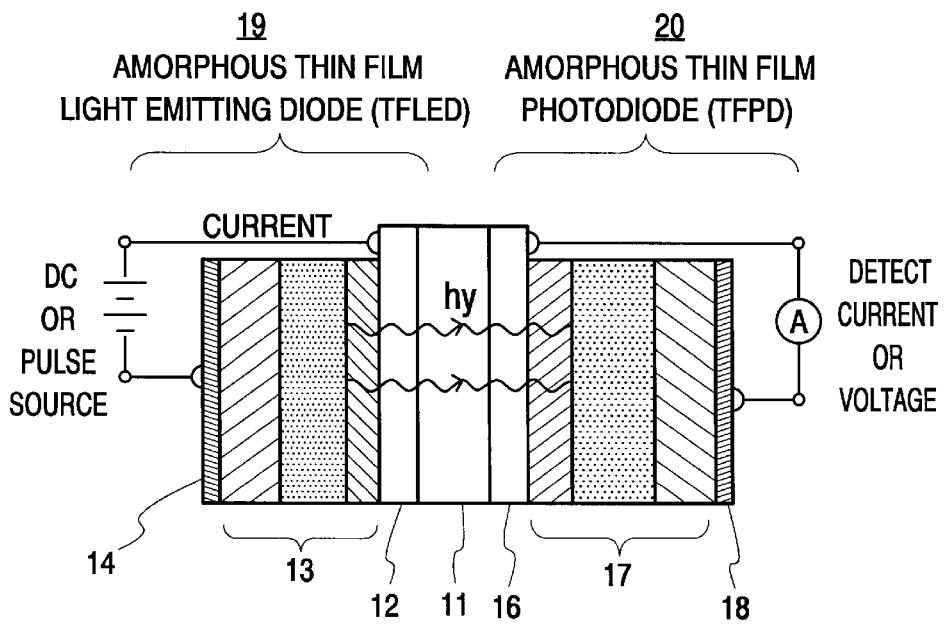
FIG. 2 is a cross-sectional view of the amorphous semiconductor photocoupler in which the light emitting diode and the light detecting cell share a common substrate.

FIG. 2 is a cross sectional view of an amorphous semiconductor photocoupler wherein the light emitting diode (19) and the light detecting solar cell (20) are deposited on the dual surfaces of the common glass substrate (11). A typical thickness of the glass substrate is 0.5–1.0 millimeter.

Figure 3:
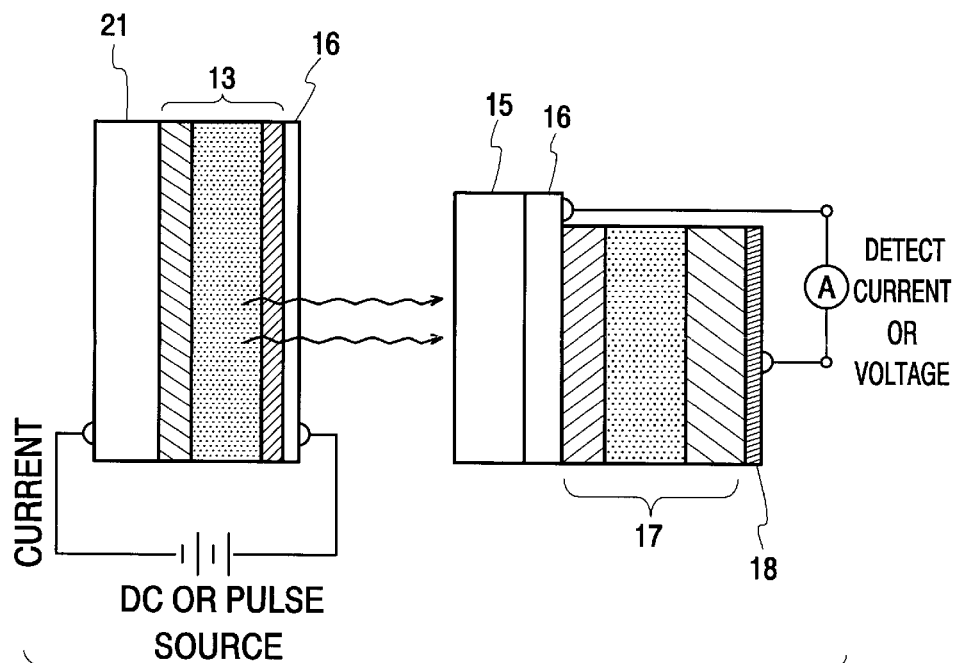
FIG. 3 is a cross-sectional view of the amorphous semiconductor photocoupler in which the light emitting diode is deposited onto a metal substrate.

FIG. 3 is a cross sectional view of an amorphous semiconductor photocoupler wherein the thin film amorphous semiconductor light emitting diode is deposited onto a metal, such as stainless steel sheet, substrate (21). One unique feature of using a metal sheet substrate is that it will not crack, while a glass substrate can crack. In addition the metal sheet substrate can provide additional strength, reflectivity and can also be used as one of the electrodes.

is a metal sheet substrate, such as stainless steel and/or aluminium.

Figure 4:
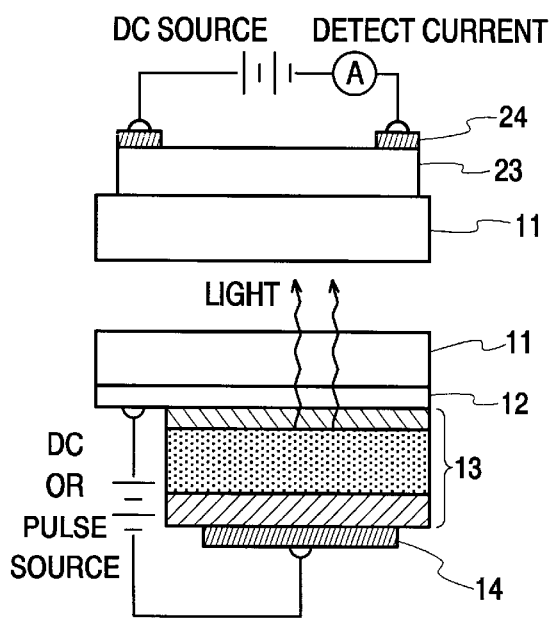
FIG. 4 is a cross-sectional view of an amorphous semiconductor photocoupler wherein the light detecting device operates in a photoconductive mode.

FIG. 4 is a cross sectional view of another type of amorphous semiconductor photocoupler in which the unique feature is that the amorphous semiconductor light detecting device operates in a photoconductive mode. The light detecting device in FIG. 4 comprises an intrinsic or lightly doped amorphous silicon thin film layer (23) with ohmic metal thin film electrodes (24) on the top. In this case, an applied voltage through the top electrodes is required. In this figure, the light emitting diode and the light detecting device are on individual glass substrates.

23 is an intrinsic or lightly doped amorphous silicon thin film.

24 is an ohmic thin film electrode, such as aluminium and silver.

Figure 5:
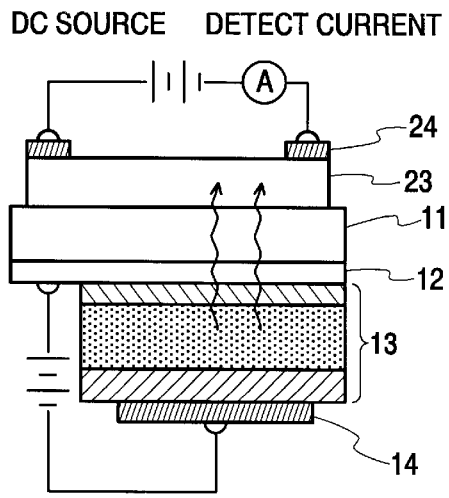
FIG. 5 is a cross-sectional view of the photocoupler of FIG. 4 but where the light emitting diode and light detecting device being deposited on a common substrate.

FIG. 5 shows a cross sectional view of the photocoupler that was shown in FIG. 4, but in FIG. 5 the light emitting diode and the light detecting device are deposited on the dual (top and bottom) surfaces of a common glass substrate. Therefore, the photocoupler in FIG. 4 acts as a photointerrupter type, while the photocoupler in FIG. 5 acts as a photoisolator type.

FIG. 6 shows some examples of the packaging designs of the above mentioned amorphous semiconductor photocouplers.

25 is a terminal for a light emitting diode.

26 is a terminal for a light detecting device.

27 is a package of the photocoupler.

28 is a cushion material, for example polymer, for the protecting of the device from a vibration or mechanical shock.

Other details of the invention of the amorphous semiconductor photocoupler can be described as follows:

The configurations of the photocoupler are shown in FIGS. 1–5. The light emitting device is an amorphous semiconductor thin film light emitting diode that comprises p-i-n junctions deposited on a substantially flat glass substrate. The amorphous semiconductor materials are, for example, amorphous silicon (a:Si:H), amorphous silicon carbide (a-SiC:H), amorphous silicon nitride (a-SiN:H), amorphous silicon oxide (a-SiO:H), amorphous carbide (a-C:H) or the combination of these materials. These films are produced by a glow discharge plasma chemical vapour deposition technique although other vacuum deposition techniques may be used. The gases used for the production of these films are either one of the following gases or the mixture thereof: silane, disilane, methane, acetylene, ammonia, nitrogen, carbon dioxide, oxygen, nitrous oxide, phosphine, diborane and hydrogen. The typical thickness for the p-i-n layers are 150 angstroms, 500 angstroms and 500 angstroms, respectively.

The light detecting device can be either solar cell (photodiode) p-i-n junctions or intrinsic or lightly doped amorphous silicon layer. In the case of p-i-n junction device, it will operate by a so-called photovoltaic effect. In the case of intrinsic or lightly doped amorphous silicon layer type, it will operate by a so-called photoconductive effect.

The light emitting diode and the light detecting device can be deposited on either separated substrates, or a common substrate. In the latter case, the devices will be deposited on the dual surfaces of the substrate.

The operation of the light emitting diode can be done by either a DC current injection mode or a pulse current injection mode.

The operation of the light detecting device can be done by either a reverse bias or none reverse bias.

The areas of the light emitting and light detecting devices can be designed according to the specific requirements, for example from millimeter square up to several centimeters square.

Figure 6A:
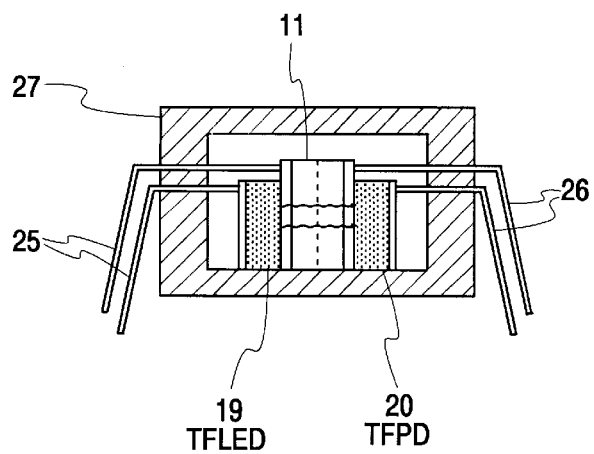
FIG. 6 shows embodiments of the amorphous semiconductor photocouplers in various design embodiments.
Figure 6C:
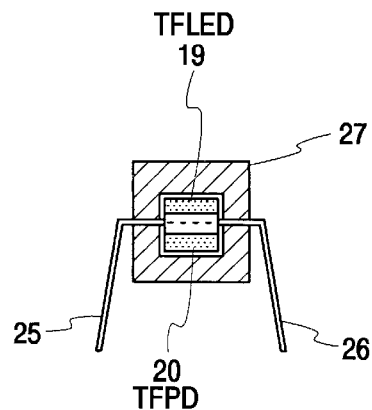
Figure 6B:
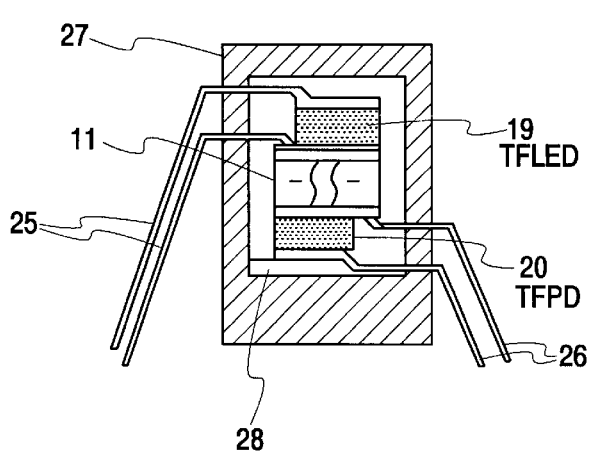

The packaging of the photocoupler can basically be done by two styles as follows:

1. The light emitting device and light detecting device are put in a sealed case that will not allow ambient light to enter, as shown in FIGS. 6(a), (b) and (c). In these cases, the photocoupler will act as a photoisolator type.

Figure 6D:
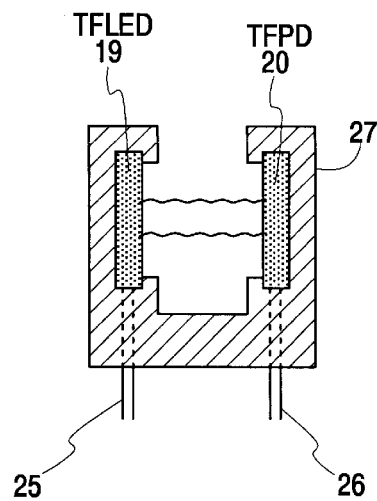

2. The light emitting device and light detecting device are put in an opened case that the light emitted from the light emitting device can be cut by a non-transparent material which moves into an area between the light emitting device and light detecting device, as shown in FIG. 6(d).

The detailed designs of the said photocoupler should involve the following factors:

1. The light emitting diode should emit light that is bright enough and has a spectrum that can be absorbed by the light detecting device. The light might either be infrared or visible light.
2. The light emitting device has p-i-n or n-i-p junctions of amorphous semiconductors and is operated by a carrier injection mechanism, so-called light emitting diode (LED).
3. The thicknesses of the glass substrate, transparent electrode, p-i-n layers, and back electrode should have preferential values. For example, the typical thickness of the glass substrate is 0.5–1.0 millimeter. The typical thicknesses of the transparent electrode, p-i-n layers and back aluminium electrode are 2000, 150, 500, 500 and 2000 angstroms, respectively.
4. In the case of using a metal sheet as a substrate instead of glass substrate, the cost of the metal sheet should not be very high, and the melting point of the material must be at least 400 C. The front surface must be smooth enough that the thin film light emitting diode can work well. Examples of the metal materials are stainless steel, copper, bronze, zinc, aluminium, and so on. The typical thickness of the stainless steel sheet is 0.5–1.0 millimeter, and the typical smoothness is of the order of 0.03 micron.
5. The pattern of the emitted light beam can be designed according to the desired application, for example, circle, rectangular, or small dots. This can be accomplished by controlling current flow through areas of the light emitting diode or by placing opaque materials on top.
6. The distance between the light emitting diode and the light detecting device is typically 1–10 millimeters, so that the light detecting device will be able to detect the light.

I claim:

1. A photocoupler including:
   an amorphous semiconductor thin film light emitting diode capable of emitting light in response to an electric stimuli;
   an amorphous semiconductor photovoltaic light detecting means adapted to detect the emitted light of the thin film light emitting diode;
   said light emitting diode comprising of a first thin film electrode, a plurality of amorphous semiconductor thin films, an optically transparent second thin film electrode, and an optically transparent substrate, arranged in a sandwich type manner, such an arrangement allowing emission of light through the optically transparent substrate when the light emitting diode is electrically stimulated; and
   said photovoltaic light detecting means comprising of a first thin film electrode, a plurality of amorphous semiconductor thin films, an optically transparent second thin film electrode, and an optically transparent substrate, arranged in a sandwich type manner, the optically transparent substrates of both the light emitting diode and the light detecting means adapted to face each other with a spatial predetermined separation.

2. A photocoupler as in claim 1 wherein the light emitting diode and the photovoltaic light detecting means share a common optically transparent substrate so that the optically transparent thin film of the light emitting diode is positioned on one side of the optically transparent substrate and the optically transparent thin film of the photovoltaic light detecting means is positioned on the opposite side of the optically transparent substrate resulting in there being no spatial separation between the light emitting diode and the photovoltaic light detecting means.

3. The photocoupler of claim 1 wherein the spectrum of the light emitting diode lies from the infrared to the UV regions.

4. The photocoupler of claim 1 wherein the thin film electrode is selected from the group including aluminium and silver.

5. The photocoupler of claim 1 wherein the amorphous semiconductor thin films have p-i-n or n-i-p junctions arid are made of materials selected from the group including amorphous silicon (a-Si) amorphous silicon carbide (a-SiC) amorphous silicon nitride (a-SiN) amorphous silicon oxide (a-SiO) or the combination of these materials.

6. The photocoupler of claim 1 wherein the optically transparent thin film electrode is selected from the group including tin oxide, indium tin oxide, zinc oxide, or a combination of these.

7. The photocoupler of claim 1 wherein the optically transparent substrate is a glass sheet.

8. The photocoupler of claim 1 wherein the photocoupler includes an insulating material adapted to shield the photocoupler from any external light.

9. The photocoupler of claim 8 wherein there are electrical terminals extending through the insulating material so as to allow electrical signals to pass from and/or to the photocoupler.

10. The photocoupler of claim 1 wherein the thicknesses of the optically transparent substrate, transparent electrode, p-i-n layers and first electrode are preferably 0.5–1 mm, 200 angstroms, 150 angstroms, 500 angstroms, 500 angstroms and 2000 angstroms, respectively.

11. The photocoupler of claim 1 wherein the typical spatial separation between the light emitting diode and the photovoltaic light detecting means is between 1 to 10 mm.

12. The photocoupler of claim 1 wherein the photovoltaic light detecting means is sensitive to light ranging from the infrared to the ultraviolet regions.

13. The photocoupler of claim 1 wherein the optically transparent substrate for the said light emitting diode and photovoltaic light detecting device can be any material provide it is optically transparent to the wavelength emitted by the light emitting diode.

14. A photocoupler including:
   an amorphous semiconductor thin film light emitting diode capable of emitting light in response to an electric stimuli;
   an amorphous semiconductor photoconductive light detecting means adapted to detect the light emitted by the thin film light emitting diode;
   said light emitting diode comprising of a first thin film electrode, a plurality of amorphous semiconductor thin films, an optically transparent second thin film electrode arid an optically transparent substrate, arranged in a sandwich type manner such an arrangement allowing emission of light through the optically transparent substrate when the light emitting diode is electrically stimulated, and
   said photoconductive light detecting means comprising of an optically transparent substrate, an amorphous silicon thin film and an ohmic thin film electrode, in a sandwich type arrangement the said photoconductive light detecting means positioned so that its optically transparent substrate faces the optically transparent substrate of the light emitting diode with a spatial predetermined separation.

15. A photocoupler as in claim 14 but wherein the light emitting diode and the photoconductive light detecting means share a common optically transparent substrate so that the optically transparent thin film of the light emitting diode is positioned on one side of the optically transparent substrate and the optically transparent thin film of the photoconductive light detecting means is positioned on the opposite side of the optically transparent substrate resulting in there being no spatial separation between the light emitting diode and the photoconductive light detecting means.

16. The photocoupler of claim 14 wherein the spectrum of the light emitting diode can be from the infrared to the UV regions.

17. The photocoupler of claim 14 wherein the thin film electrode is selected from the group including aluminium and silver.

18. The photocoupler of claim 14 wherein the amorphous semiconductor thin films have p-i-n or n-i-p junctions and are made of materials selected from the group including amorphous silicon (a-Si) amorphous silicon carbide (a-SiC) amorphous silicon nitride (a-SiN) amorphous silicon oxide (a-SiO) or the combination of these materials.

19. The photocoupler of claim 14 wherein the ohmic thin film electrode of the photoconductive light detecting means is selected from the group including aluminium and silver.

20. The photocoupler of claim 14 wherein the optically transparent substrate is a glass sheet.

21. The photocoupler of claim 14 wherein the amorphous silicon thin film of the photoconductor is intrinsically or lightly doped.

22. The photocoupler of claim 14 wherein the photocoupler is insulated from external light by insulating material.

23. The photocoupler of claim 14 wherein the thicknesses of the optically transparent substrate, transparent electrode, p-i-n layers and first electrode are preferably 0.5–1 mm, 200 angstroms, 150 angstroms, 500 angstroms, 500 angstroms and 2000 angstroms, respectively.

24. The photocoupler of claim 1 further adapted to allow for the detection of an object when placed in between the light emitting diode and the photovoltaic light detecting device so as to prevent at least some of the emitted light reaching the light detecting device.

25. The photocoupler of claim 14 further adapted to allow for the detection of an object when placed in between the light emitting diode and the photovoltaic light detecting device so as to prevent at least some of the emitted light reaching the light detecting device.

* * * * *